US012616998B2

(12) United States Patent
Chiu et al.

(10) Patent No.: US 12,616,998 B2
(45) Date of Patent: May 5, 2026

(54) MANUFACTURING METHOD OF WAFER LEVEL ULTRASONIC DEVICE

(71) Applicant: SonicMEMS (ZhengZhou) Technology Co., Ltd., Zhengzhou (CN)

(72) Inventors: Yi-Hsiang Chiu, Zhengzhou (CN); Hung-Ping Lee, Zhengzhou (CN)

(73) Assignee: SONICMEMS (ZHENGZHOU) TECHNOLOGY CO., LTD., Zhengzhou (CN)

( * ) Notice: Subject to any disclaimer, the term of this patent is extended or adjusted under 35 U.S.C. 154(b) by 433 days.

(21) Appl. No.: 18/471,004

(22) Filed: Sep. 20, 2023

(65) Prior Publication Data

US 2024/0009702 A1 Jan. 11, 2024

Related U.S. Application Data

(62) Division of application No. 16/875,525, filed on May 15, 2020, now Pat. No. 11,806,751.

(30) Foreign Application Priority Data

Dec. 4, 2019 (TW) ................................. 108144395

(51) Int. Cl.
*B06B 1/06* (2006.01)
*G06V 40/13* (2022.01)
(Continued)

(52) U.S. Cl.
CPC .......... *B06B 1/0622* (2013.01); *B06B 1/0611* (2013.01); *G06V 40/1306* (2022.01);
(Continued)

(58) Field of Classification Search
CPC . B06B 1/0622; B06B 1/0611; G06V 40/1306; G06V 40/1329; H10N 30/06; H10N 30/072; H10N 30/02; H10N 30/2047; H10N 30/082; H10N 30/883; H10N 30/875; H10N 30/101
See application file for complete search history.

(56) References Cited

U.S. PATENT DOCUMENTS 11,075,072 B2 7/2021 Jin
2014/0265726 A1* 9/2014 Andosca ................ H10N 30/05
29/25.35
(Continued)

*Primary Examiner* — Brigitte A Paterson
(74) *Attorney, Agent, or Firm* — MUNCY, GEISSLER, OLDS & LOWE, P.C.

(57) ABSTRACT

A manufacturing method of a wafer level ultrasonic device includes: forming a first piezoelectric material layer, a first electrode material layer, a second piezoelectric material layer, and a second electrode material layer in sequence on a substrate; removing parts of those layers to form an ultrasonic element including a first electrode and a second electrode; forming a first protective layer on the ultrasonic element, and forming a first through hole and a second through hole exposing a part of the first electrode and a part of the second electrode; forming a first conductive layer and a second conductive layer on the first protective layer and connecting to the first electrode and the second electrode; forming a second protective layer; and connecting a base with an opening and the second protective layer in a vacuum environment to form a closed cavity.

4 Claims, 5 Drawing Sheets

(51) Int. Cl.

| | |
|---|---|
| *H10N 30/00* | (2023.01) |
| *H10N 30/02* | (2023.01) |
| *H10N 30/06* | (2023.01) |
| *H10N 30/072* | (2023.01) |
| *H10N 30/082* | (2023.01) |
| *H10N 30/20* | (2023.01) |
| *H10N 30/87* | (2023.01) |
| *H10N 30/88* | (2023.01) |

(52) U.S. Cl.
CPC ......... *G06V 40/1329* (2022.01); *H10N 30/02* (2023.02); *H10N 30/06* (2023.02); *H10N 30/072* (2023.02); *H10N 30/082* (2023.02); *H10N 30/101* (2024.05); *H10N 30/2047* (2023.02); *H10N 30/875* (2023.02); *H10N 30/883* (2023.02)

(56) References Cited

U.S. PATENT DOCUMENTS

| | | | |
|---|---|---|---|
| 2017/0128983 A1* | 5/2017 | Horsley .............. | H10N 30/875 |
| 2019/0235232 A1* | 8/2019 | Sekine ................ | G02B 26/101 |
| 2019/0262865 A1 | 8/2019 | Mehdizadeh | |
| 2020/0035654 A1* | 1/2020 | Chen .................... | H10N 30/88 |
| 2020/0179979 A1 | 6/2020 | Jin | |
| 2020/0191646 A1 | 6/2020 | Jin | |
| 2020/0313073 A1 | 10/2020 | Wang | |
| 2021/0013026 A1 | 1/2021 | Jin | |
| 2021/0193903 A1 | 6/2021 | Shi | |

* cited by examiner

MANUFACTURING METHOD OF WAFER LEVEL ULTRASONIC DEVICE

CROSS-REFERENCE TO RELATED APPLICATION

This non-provisional application is a Division of application Ser. No. 16/875,525, filed on May 15, 2020, with claiming priority under 35 U.S.C. § 119(a) to Patent Application No. 108144395 in Taiwan, R.O.C. on Dec. 4, 2019, the entire contents of which are hereby incorporated by reference.

BACKGROUND

Technical Field

The present invention relates to an ultrasonic transmission technology, and in particular, to a wafer level ultrasonic device and a manufacturing method thereof.

Related Art

With the development of smartphones and application programs, an increasing scope of individual life is covered. For example, smartphones are widely applied to mobile payment, electronic keys, and the like nowadays. A large amount of important individual information is stored in the smartphone. Therefore, once the smartphone is missing, the information is likely to be stolen, resulting in a great loss.

Therefore, in addition to setting a password generally, many functions such as face recognition, iris recognition, and fingerprint recognition, which use a personal feature to assist in encryption, have been developed. Fingerprint recognition is used most commonly at present, which, however, still has the problem of inaccurate recognition.

In the current fingerprint recognition technology, a finger touches an upper cover of an ultrasonic module or a screen protective layer of a smart electronic device; the ultrasonic module sends an ultrasonic signal to the finger and receives a strength of the ultrasonic signal reflected by peaks and roughs of the fingerprint, so that the fingerprint can be recognized. However, the ultrasonic signal of the ultrasonic module may be transmitted to an area not in contact with the finger through a medium. In this case, the reflected ultrasonic signal received by the ultrasonic module may not necessarily be reflected by the finger. Therefore, it is difficult to recognize the fingerprint.

SUMMARY

It should be understood that, when an element is referred to as being "connected to" another element, it may indicate that the element is directly connected to the another element, or there is a middle element.

In addition, it should be understood that although terms such as "first", "second", and "third" in this specification may be used for describing various elements, components, areas, or parts, the elements, components, areas, or parts are not limited by such terms. The terms are only used to distinguish one element, component, area, or part from another element, component, area, or part.

In addition, terms such as "on", "below", "top", and "bottom" are used for describing a relative relationship between one element and another element. It should be understood that such relative terms are intended to encompass different orientations of the device in addition to the orientation depicted in the figures. For example, if the device in the figures is turned over, an element described as being "below" another element will then be "above" the other element.

Herein, a manufacturing method of a wafer level ultrasonic device is provided. The method includes: forming an ultrasonic element on a substrate, where the ultrasonic element includes a first electrode and a second electrode that is not connected to the first electrode; forming a first protective layer on the ultrasonic element and the substrate, and forming a first through hole and a second through hole that expose a part of the first electrode and a part of the second electrode; forming a first conductive layer and a second conductive layer on the first protective layer, where a part of the first conductive layer is in the first through hole and is connected to the first electrode, and a part of the second conductive layer is in the second through hole and is connected to the second electrode; forming a second protective layer on the ultrasonic element, the first protective layer, the first conductive layer, and the second conductive layer; providing a base, and connecting the base and the second protective layer in a vacuum environment, where the base is provided with an opening, and the opening forms a closed cavity with the protective layer; removing the substrate; forming a first electrical connection region and a second electrical connection region on the base, and forming, on the second protective layer, a first groove and a second groove that expose a part of the first conductive layer and a part of the second conductive layer, where the first electrical connection region and the second electrical connection region are in communication with the first groove and the second groove respectively; and filling the first electrical connection region, the second electrical connection region, the first groove, and the second groove with metal materials, so that the metal materials are connected to the first conductive layer and the second conductive layer. Herein, the step of forming the ultrasonic element includes: forming a first piezoelectric material layer, a first electrode material layer, a second piezoelectric material layer, and a second electrode material layer in sequence; and removing parts of the first piezoelectric material layer, the first electrode material layer, the second piezoelectric material layer, and the second electrode material layer, to form a first piezoelectric layer, the first electrode, a second piezoelectric layer, and the second electrode, where the second piezoelectric layer and the second electrode expose a part of the first electrode.

In some embodiments, the step of forming the first electrical connection region and the second electrical connection region includes penetrating the base to form two through holes as the first electrical connection region and the second electrical connection region, and removing a part of the protective layer to form the first groove and the second groove. Furthermore, the method further includes: forming two bonding pads on one side, away from the protective layer, of the base, where the two bonding pads are respectively connected to the metal materials in the first electrical connection region and the second electrical connection region.

In some embodiments, the step of forming the first electrical connection region and the second electrical connection region includes removing edges of the base and the protective layer to form the first electrical connection region and the second electrical connection region.

Based on the foregoing, by using the closed cavity between the base and the protective layer, the speed of ultrasonic transmission through vacuum and a general medium changes obviously. Therefore, a transfer direction of a signal can be clearly distinguished. Furthermore, because a propagation direction of an ultrasonic signal may be recognized clearly, functions such as gesture sensing may be further provided, and can be applied to a tablet and a television with a large size.

DETAILED DESCRIPTION

Figure 1A:
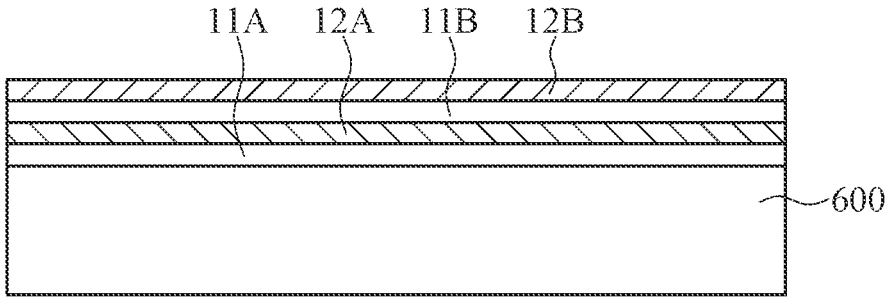
FIG. 1A to FIG. 1I are stepwise schematic cross-sectional views of a manufacturing method of the wafer level ultrasonic device according to the first embodiment.
Figure 1B:
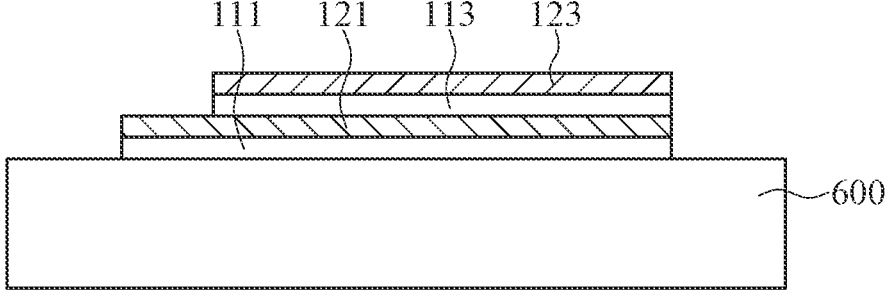

FIG. 1A to FIG. 1I are stepwise schematic cross-sectional views of a manufacturing method of the wafer level ultrasonic device according to the first embodiment. As shown in FIG. 1A, the manufacturing method of the wafer level ultrasonic device according to the first embodiment includes: first, forming a first piezoelectric material layer 11A, a first electrode material layer 12A, a second piezoelectric material layer 11B, and a second electrode material layer 12B on a substrate 600 in sequence; next, as shown in FIG. 1B, removing parts of the first piezoelectric material layer 11A, the first electrode material 12A, the second piezoelectric material layer 11B, and the second electrode material layer 12B, to form the first piezoelectric layer 111, the first electrode 121, the second piezoelectric layer 113, and the second electrode 123, where the first electrode 121 is not connected to the second electrode 123. Lengths of the second piezoelectric layer 113 and the second electrode 123 are shorter than those of the first piezoelectric layer 111 and the first electrode 121, so that a part of the first electrode 121 is exposed, thus completing manufacturing of the ultrasonic element 10.

Figure 1C:
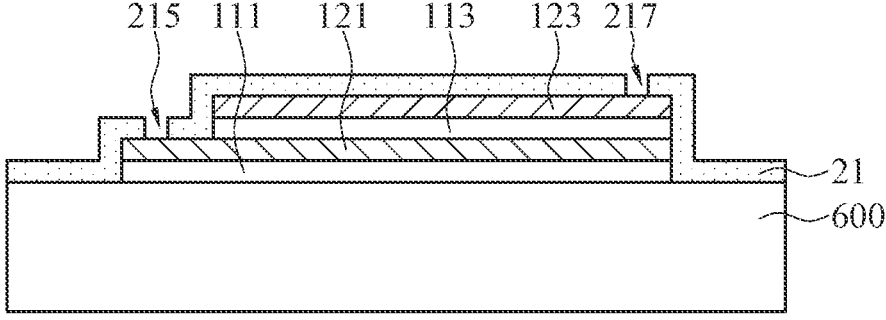

As shown in FIG. 1C, the first protective layer 21 is formed on the ultrasonic element 10 and the substrate 600. The first protective layer 21 is provided with a first through hole 215 and a second through hole 217 that expose a part of the first electrode 121 and a part of the second electrode 123. Herein, the first protective layer 21 may be manufactured by means of lithography, and may be also manufactured by means of laser punching after coating. However, the above are only examples, and not intended for limitation.

Figure 1D:
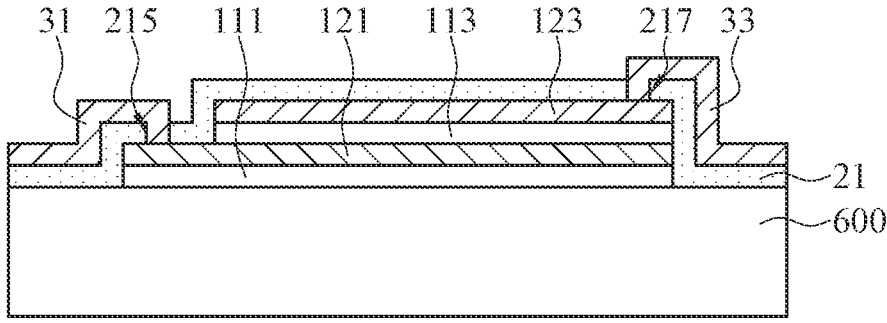

Then, as shown in FIG. 1D, the first conductive layer 31 and the second conductive layer 33 are formed on the first protective layer 21. A part of the first conductive layer 31 is in the first through hole 215 and is connected to the first electrode 121. A part of the second conductive layer 33 is in the second through hole 217 and is connected to the second electrode 123. Similarly, the first conductive layer 31 and the second conductive layer 33 may be also manufactured by means of lithography.

Figure 1E:
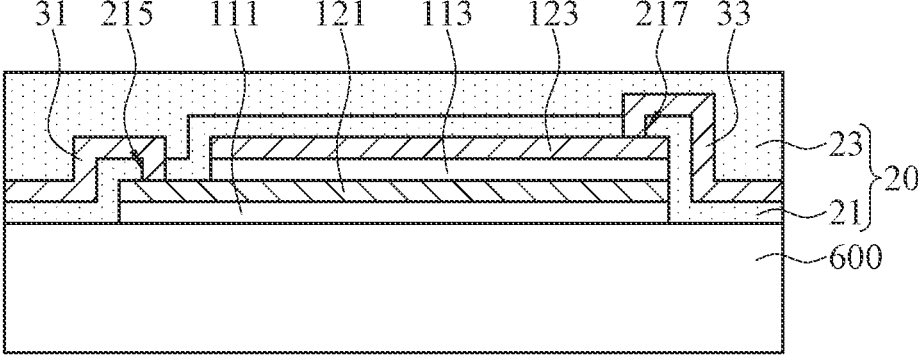

As shown in FIG. 1E, the second protective layer 23 is formed on the ultrasonic element 10, the first protective layer 21, the first conductive layer 31, and the second conductive layer 33.

Figure 1F:
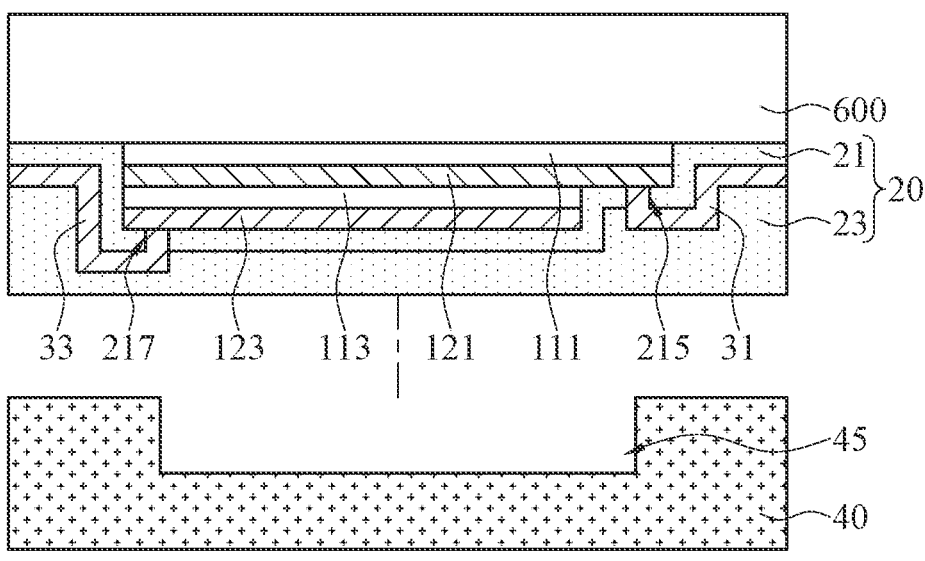
Figure 1G:
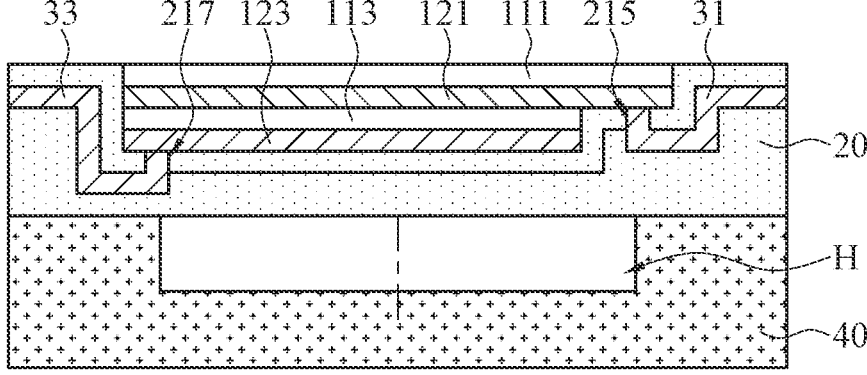

Subsequently, as shown in FIG. 1F, an original structure is reversed, and the base 40 is provided. The base 40 and the second protective layer 20 are connected in a vacuum environment. The base 40 is provided with the opening 45, and the opening 45 forms the closed cavity H with the protective layer 20. As shown in FIG. 1G, the substrate 600 is removed.

Figure 1H:
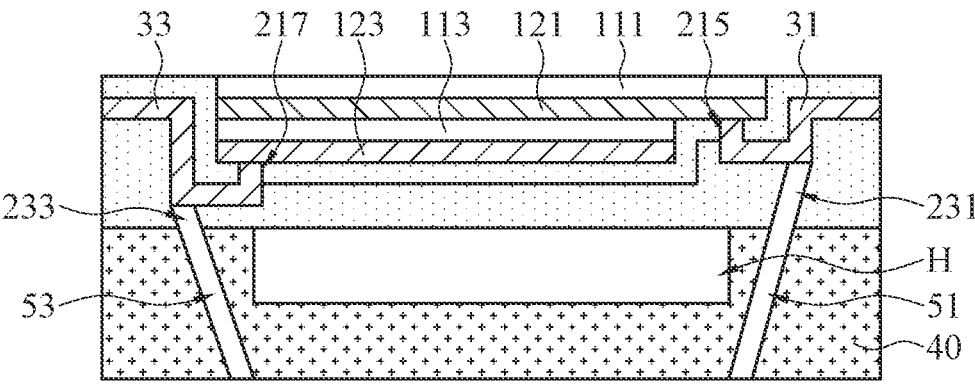

As shown in FIG. 1H, the first electrical connection region 51 and the second electrical connection region 53 are formed on the base 40. The second protective layer 23 forms a first groove 231 and a second groove 233 that expose a part of the first conductive layer 31 and a part of the second conductive layer 33. The first electrical connection region 51 and the second electrical connection region 53 are in communication with the first groove 231 and the second groove 233 respectively. In the state of the first embodiment, a punching technology is used. The first electrical connection region 51 and the first groove 231 are substantially completed by a same punching procedure, and the second electrical connection region 53 and the second groove 233 are substantially completed by a same punching procedure.

Figure 1I:
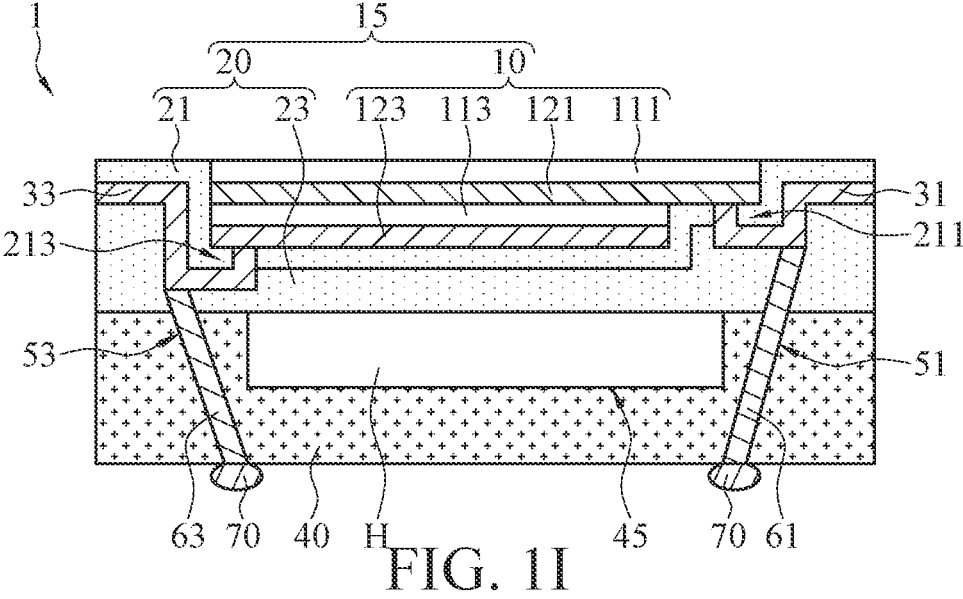

Finally, as shown in FIG. 1I, the first electrical connection region 51, the second electrical connection region 53, the first groove 231, and the second groove 233 are filled with the metal materials 61 and 63, so that the metal materials 61 and 63 are connected to the first conductive layer 31 and the second conductive layer 33. Further, the method further includes forming the two bonding pads 70. The bonding pads 70 are on one side, away from the protective layer 20, of the base 40, and are respectively connected to the metal materials 61 and 63 in the first electrical connection region 51 and the second electrical connection region 53.

Figure 2H:
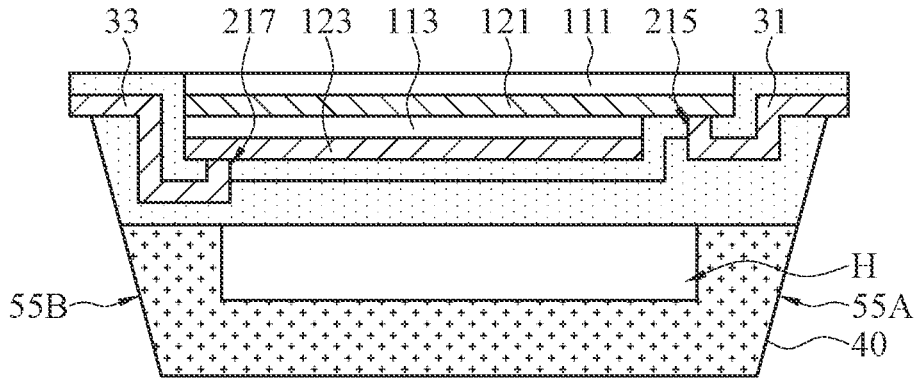
FIG. 2H to FIG. 2I are stepwise schematic cross-sectional views of a manufacturing method of the wafer level ultrasonic device according to the second embodiment.
Figure 2I:
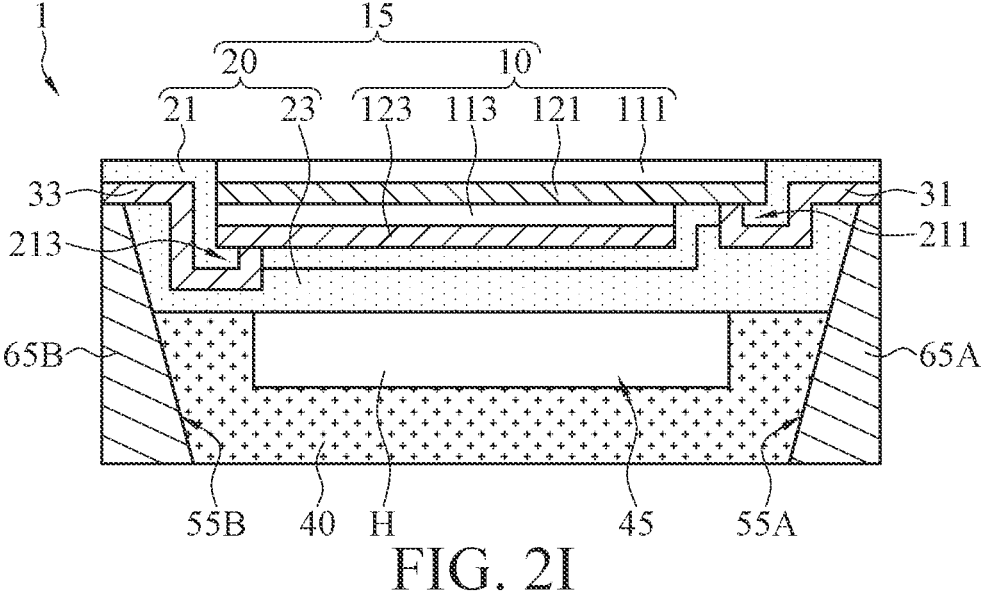

FIG. 2H to FIG. 2I are stepwise schematic cross-sectional views of a manufacturing method of the wafer level ultrasonic device according to the second embodiment. The manufacturing method of the second embodiment is roughly the same as FIG. 1A to FIG. 1G of the first embodiment, and details are not described herein again. FIG. 2H shows a first electrical connection region 51A and a second electrical connection region 51B formed by directly removing parts of edges of the base 40 and the protective layer 20. In this case, regions of the first conductive layer 31 and the second conductive layer 33, which are exposed after the protective layer 20 is removed, may be treated as the first groove and the second groove (not shown in the figure). Finally, as shown in FIG. 2I, the first electrical connection region 51A and the second electrical connection region 51B are filled with metal materials 61A and 61B, and the wafer level ultrasonic device 1 of the second embodiment is completed.

Based on the foregoing, by using the closed cavity H between the base 40 and the protective layer 20 of the wafer level ultrasonic device, the speed of ultrasonic transmission through vacuum and a general medium changes obviously. Therefore, a transfer direction of a signal can be clearly distinguished. In addition to fingerprint recognition, functions such as gesture sensing may be further provided though a high resolution of the wafer level ultrasonic device. In addition, a manufacturing process is simple, and a manufacturing cost may be reduced greatly.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A manufacturing method of a wafer level ultrasonic device, comprising:

forming an ultrasonic element on a substrate, wherein the ultrasonic element comprises a first electrode and a second electrode that is not connected to the first electrode;

forming a first protective layer on the ultrasonic element and the substrate, and forming a first through hole and a second through hole that expose a part of the first electrode and a part of the second electrode;

forming a first conductive layer and a second conductive layer on the first protective layer, wherein a first conductive part of the first conductive layer is in the first through hole and is connected to the first electrode, and a second conductive part of the second conductive layer is in the second through hole and is connected to the second electrode;

forming a second protective layer on the ultrasonic element, the first protective layer, the first conductive layer, and the second conductive layer;

providing a base, and connecting the base and the second protective layer in a vacuum environment, wherein the base has an opening, and the opening forms a closed cavity with the protective layer; removing the substrate;

forming a first electrical connection region and a second electrical connection region on the base, and forming a first groove and a second groove on the second protective layer, wherein the first groove and the second groove expose a first connection part of the first conductive layer and a second connection part of the second conductive layer respectively, and the first electrical connection region and the second electrical connection region are in communication with the first groove and the second groove respectively; and filling the first electrical connection region, the second electrical connection region, the first groove, and the second groove with a metal material, so that the metal material is connected to the first conductive layer and the second conductive layer, wherein the step of forming the ultrasonic element comprises:

forming a first piezoelectric material layer, a first electrode material layer, a second piezoelectric material layer, and a second electrode material layer in sequence; and removing parts of the first piezoelectric material layer, the first electrode material layer, the second piezoelectric material layer, and the second electrode material layer, to form a first piezoelectric layer, the first electrode, a second piezoelectric layer, and the second electrode, wherein the second piezoelectric layer and the second electrode expose a part of the first electrode.

2. The manufacturing method of a wafer level ultrasonic device according to claim 1, wherein the step of the forming the first electrical connection region and the second electrical connection region comprises penetrating the base to form two through holes as the first electrical connection region and the second electrical connection region, and removing a part of the protective layer to form the first groove and the second groove.

3. The manufacturing method of a wafer level ultrasonic device according to claim 2, further comprising: forming two bonding pads on one side, away from the protective layer, of the base, wherein the two bonding pads are respectively connected to the metal materials in the first electrical connection region and the second electrical connection region.

4. The manufacturing method of a wafer level ultrasonic device according to claim 1, wherein the step of the forming the first electrical connection region and the second electrical connection region comprises removing edges of the base and the protective layer to form the first electrical connection region and the second electrical connection region.

* * * * *